United States Patent
Sakai et al.

(10) Patent No.: US 9,130,290 B2
(45) Date of Patent: Sep. 8, 2015

(54) BELLOWS BODY CONTACTOR HAVING A FIXED TOUCH PIECE

(75) Inventors: Takahiro Sakai, Moriyama (JP); Yoshinobu Hemmi, Otsu (JP)

(73) Assignee: OMRON CORPORATION, Kyoto (JP)

( * ) Notice: Subject to any disclaimer, the term of this patent is extended or adjusted under 35 U.S.C. 154(b) by 0 days.

(21) Appl. No.: 14/342,529

(22) PCT Filed: Mar. 15, 2012

(86) PCT No.: PCT/JP2012/056655
§ 371 (c)(1),
(2), (4) Date: Mar. 3, 2014

(87) PCT Pub. No.: WO2013/054555
PCT Pub. Date: Apr. 18, 2013

(65) Prior Publication Data
US 2014/0235112 A1 Aug. 21, 2014

(30) Foreign Application Priority Data
Oct. 14, 2011 (JP) .................................. 2011-227161

(51) Int. Cl.
*H01R 13/24* (2006.01)
*G01R 1/067* (2006.01)
(52) U.S. Cl.
CPC ............ *H01R 13/24* (2013.01); *G01R 1/06722* (2013.01); *H01R 13/2428* (2013.01); *H01R 2201/20* (2013.01)
(58) Field of Classification Search
USPC ........................................... 439/824, 700, 66
See application file for complete search history.

(56) References Cited

U.S. PATENT DOCUMENTS

| 3,134,954 | A  | * | 5/1964  | Braun ............................ 338/66 |
| 4,161,346 | A  |   | 7/1979  | Cherian |
| 6,464,511 | B1 | * | 10/2002 | Watanabe et al. ............... 439/66 |
| 7,150,658 | B1 | * | 12/2006 | Chien ........................... 439/700 |
| 2006/0020615 | A1 | * | 1/2006 | Keohane et al. .............. 707/101 |
| 2009/0111289 | A1 | * | 4/2009 | Vinther .......................... 439/66 |
| 2009/0156022 | A1 |   | 6/2009 | Akama |
| 2014/0218062 | A1 | * | 8/2014 | Sakai et al. .............. 324/755.04 |
| 2014/0225638 | A1 | * | 8/2014 | Sakai et al. .............. 324/755.04 |
| 2014/0227912 | A1 | * | 8/2014 | Sakai et al. .................. 439/700 |

FOREIGN PATENT DOCUMENTS

| JP | S5537787 A | 3/1980 |
| JP | 10125428   | 5/1998 |
| JP | 10510947 A | 10/1998 |

(Continued)

OTHER PUBLICATIONS

Japanese Office Action for corresponding application JP 2011-227161; Report Dated Oct. 28, 2014.

(Continued)

*Primary Examiner* — Chandrika Prasad
(74) *Attorney, Agent, or Firm* — Shinjyu Global IP

(57) ABSTRACT

A contactor including a bellows body, a fixed portion, connected to one end of the bellows body and provided with at least one fixed touch piece extending along the bellows body, and a movable portion, connected to the other end of the bellows body, where the movable portion is configured to be depressed to compress the bellows body and to bring the movable portion and/or the bellows body into contact with the fixed touch piece of the fixed portion.

20 Claims, 10 Drawing Sheets

(56) References Cited

FOREIGN PATENT DOCUMENTS

| JP | 2002008760 | | 1/2002 |
|----|------------|---|--------|
| JP | 2002134202 | A | 5/2002 |
| JP | 2002164135 | | 6/2002 |
| JP | 2003307525 | A | 10/2003 |
| JP | 2004138391 | | 5/2004 |
| JP | 3120893 | U | 4/2006 |
| JP | 3122168 | U | 6/2006 |
| JP | 2008047417 | | 2/2008 |
| JP | 2009128218 | | 6/2009 |
| JP | 2009146817 | | 7/2009 |
| JP | 2011502339 | | 1/2011 |
| JP | 2011146295 | | 7/2011 |
| JP | 2004138405 | A | 5/2013 |

OTHER PUBLICATIONS

Extended European Search Report for corresponding application EP12840730; Mail date Dec. 12, 2014.
International Search Report for corresponding application PCT/JP2012/056658 filed Mar. 15, 2012; Mail date Jun. 5, 2012.
International Search Report for corresponding application PCT/JP2012/056654 filed Mar. 15, 2012; Mail date Jun. 5, 2012.
International Search Report for corresponding application PCT/JP2012/056655 filed Mar. 15, 2012; Mail date Jun. 5, 2012.
International Search Report for corresponding application PCT/JP2012/056657 filed Mar. 15, 2012; Mail date Jun. 5, 2012.

\* cited by examiner

BELLOWS BODY CONTACTOR HAVING A FIXED TOUCH PIECE

CROSS REFERENCE TO RELATED APPLICATION

This application is the United States National Phase of International Patent Application Number PCT/JP2012/056655 filed on 15 Mar. 2012 which claims priority to Japanese Patent Application No. 2011-227161 filed on 14 Oct. 2011, all of which said applications are herein incorporated by reference in their entirety.

TECHNICAL FIELD

The present invention relates to a contactor, and for example, relates to a contactor used for an integrated circuit inspection probe.

BACKGROUND ART

In the past, a contactor used for an integrated circuit inspection probe, has traditionally been a contactor of an electronic terminal receptacle, which holds contact between an electrode terminal of an electronic component and an electrode portion of a receptacle body by depressing the electronic component to the receptacle body, and which connects the electrode portion of the receptacle body to an electrode terminal of a connected electronic component. The electrode portion of the receptacle main body is formed by performing punching on an elastic plate material with a predetermined thickness, and has at both ends a pair of contacts respectively connected with the electrode terminal of the electronic component and the electrode terminal of the connected electronic component, while having a meandering portion successively installed in parallel and provided between the pair of contacts to connect the pair of contacts. Such configuration can be see, for example, in Japanese Unexamined Patent Publication No. 2002-134202.

However, in the contactor of the foregoing electronic terminal receptacle, the number of folds of the meandering portion is small and a desired displacement amount is thus difficult to ensure, which leads to lowered usability. For this reason, in order to ensure the desired displacement amount, a long contactor of the electronic terminal receptacle can be used where the number of folds has been increased. However, when the meandering portion of the long contactor becomes narrow, electric resistance increases to make it difficult for a current to flow and there are thus imposing problematic limits on lengthening of the contactor.

BRIEF SUMMARY OF THE INVENTION

In view of the foregoing, the invention provides a contactor having desired conductivity while ensuring a predetermined displacement amount.

A contactor is provided including a bellows body, a fixed portion, connected to one end of the bellows body and provided with at least one fixed touch piece extending along the bellows body, and a movable portion, connected to the other end of the bellows body, where the movable portion is configured to be depressed to compress the bellows body and to bring the movable portion into contact with the fixed touch piece of the fixed portion.

A further contactor is provided including a bellows body, a fixed portion, connected to one end of the bellows body and provided with at least one fixed touch piece extending along the bellows body, and a movable portion, connected to the other end of the bellows body, where the movable portion is configured to be depressed to compress the bellows body and to bring the bellows body into contact with the fixed touch piece of the fixed portion.

DETAILED DESCRIPTION

Embodiments of a contactor according to the present invention will be described in accordance with the accompanying drawing of FIGS. 1 to 8.

Figure 1:
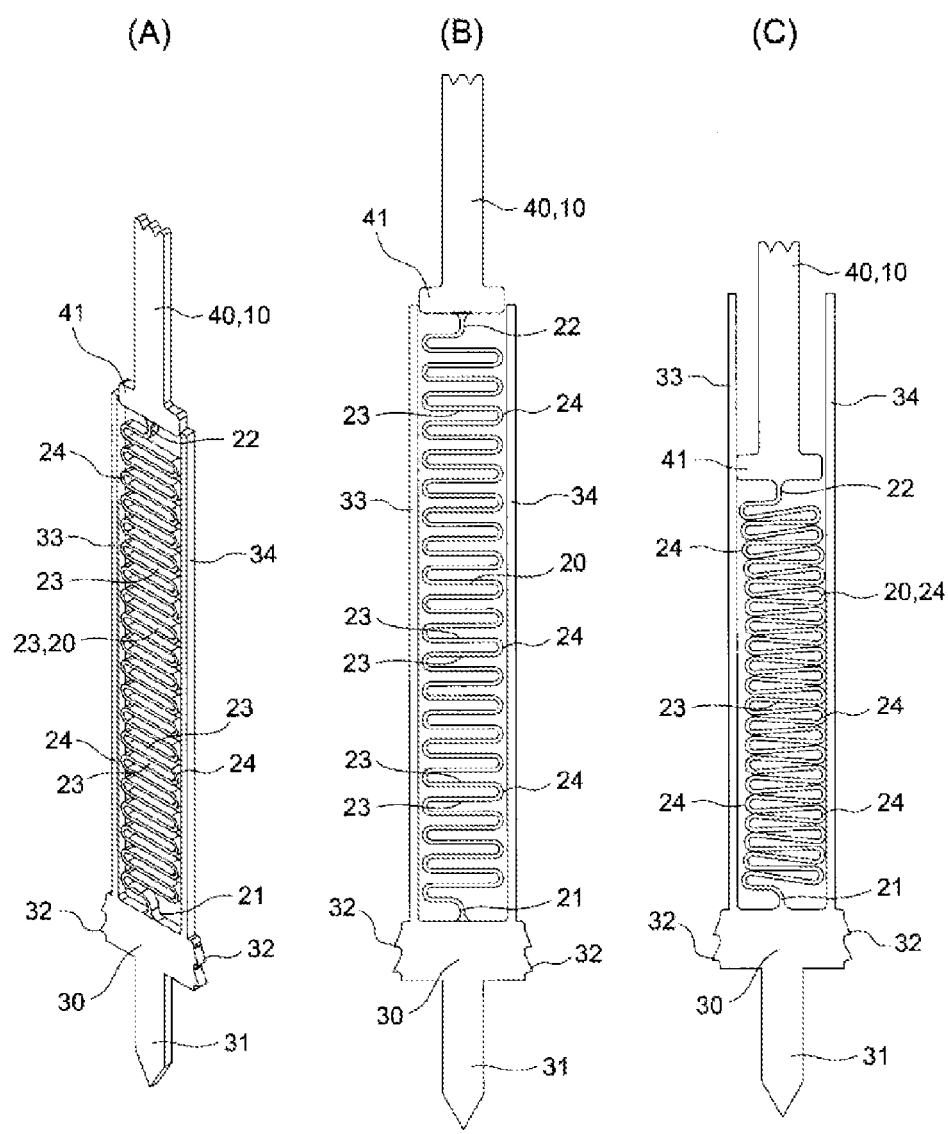
FIG. 1A is a perspective view showing a first embodiment of a contactor according to the present invention.
FIGS. 1B and 1C are front views respectively showing the contactor before and after an operation.
Figure 2:
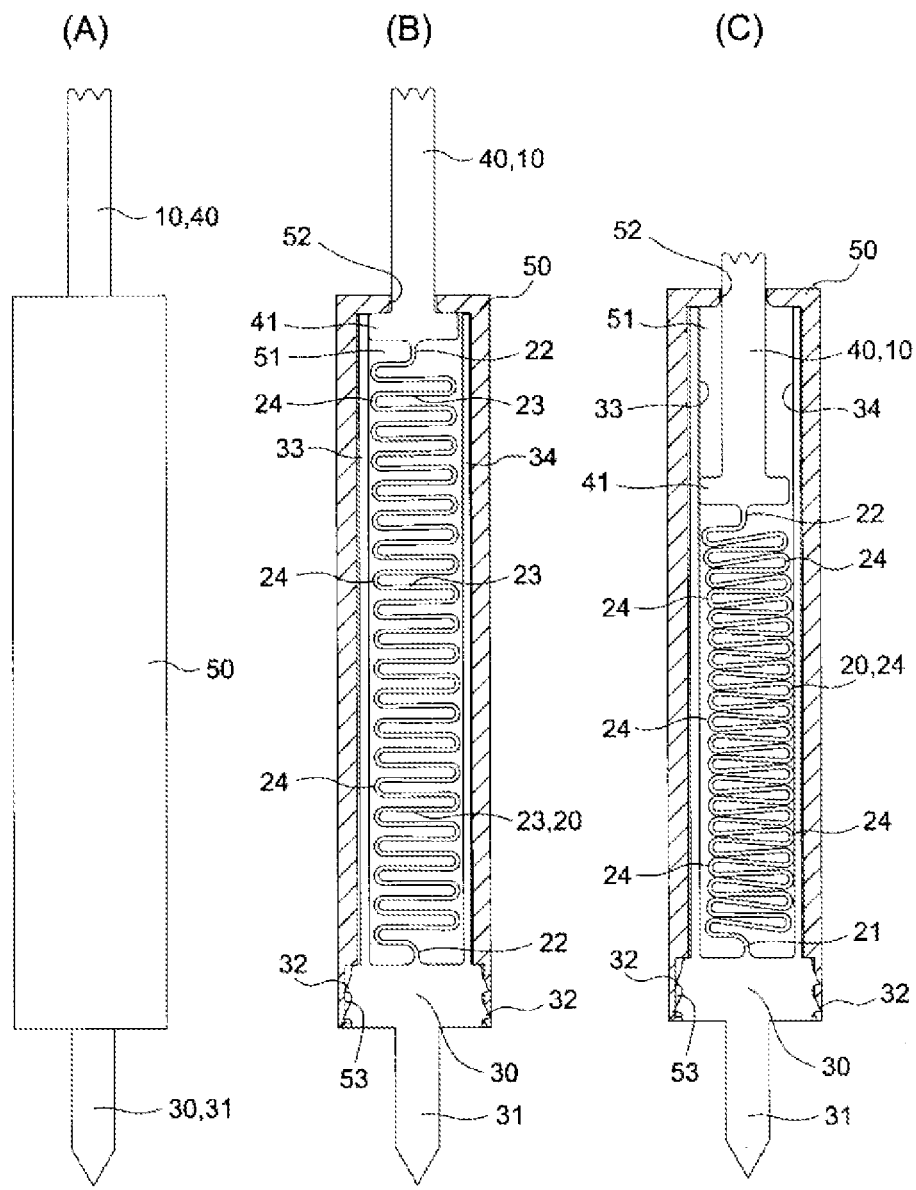
FIG. 2A is a front view of a state where the contactor shown in FIG. 1 has been housed inside a housing.
FIGS. 2B and 2C are front sectional views respectively showing the contactors before and after the operation.

A first embodiment is one in which, as shown in FIGS. 1 and 2, a contactor 10 is formed of a bellows body 20, a fixed portion 30 connected to one end 21 of the bellows body 20, and a movable portion 40 connected to the other end 22 of the bellows body 20. The contactor 10 is housed inside a housing 50.

The bellows body 20 is formed of linear-shaped intermediate portions 23 and arc portions 24 each connecting adjacent intermediate portions 23. The bellows body 20 may have a cross section with an aspect ratio being not smaller than 1.5, preferably not smaller than 2, and may be formed by pressing or by electroforming. It is to be noted that the aspect ratio here refers to a ratio of a thickness and a height on the cross section of the bellows body 20.

The one end 21 of the bellows body 20 is connected onto a shaft center of the fixed portion 30 at an upper end thereof, and a terminal portion 31 is extended at a lower end of the fixed portion 30 along the shaft center. Further, locking claw portions 32 are projectingly provided on both side surfaces of the fixed portion 30, while fixed touch pieces 33, 34 are extended from both side edges of the upper end of the fixed portion 30 in parallel along the bellows body 20.

The movable portion 40 has the front surface in a substantially T-shape, and the other end 22 of the bellows body 20 is connected onto the shaft center at a lower end of a large width portion 41 of the movable portion 40.

As shown in FIG. 2, the housing 50 has a rectangular-parallelepiped shape having a slit 51 where the contactor 10 can be housed, and the upper end surface of the housing 50 has an operation hole 52, while the lower end surface thereof has a press-fitting hole 53.

As shown in FIG. 2, when the movable portion 40 is pressed down, the bellows body 20 is compressed, and thereby the large width portion 41 slides on the inner side surfaces of the fixed touch pieces 33, 34. Meanwhile, the arc portions 24 come into contact with the fixed touch pieces 33, 34, and the adjacent arc portions 24 come into contact with each other, to cause a short circuit. Hence the contact resistance decreases according to a displacement amount of the movable portion 40, to allow a current to flow.

Figure 3:
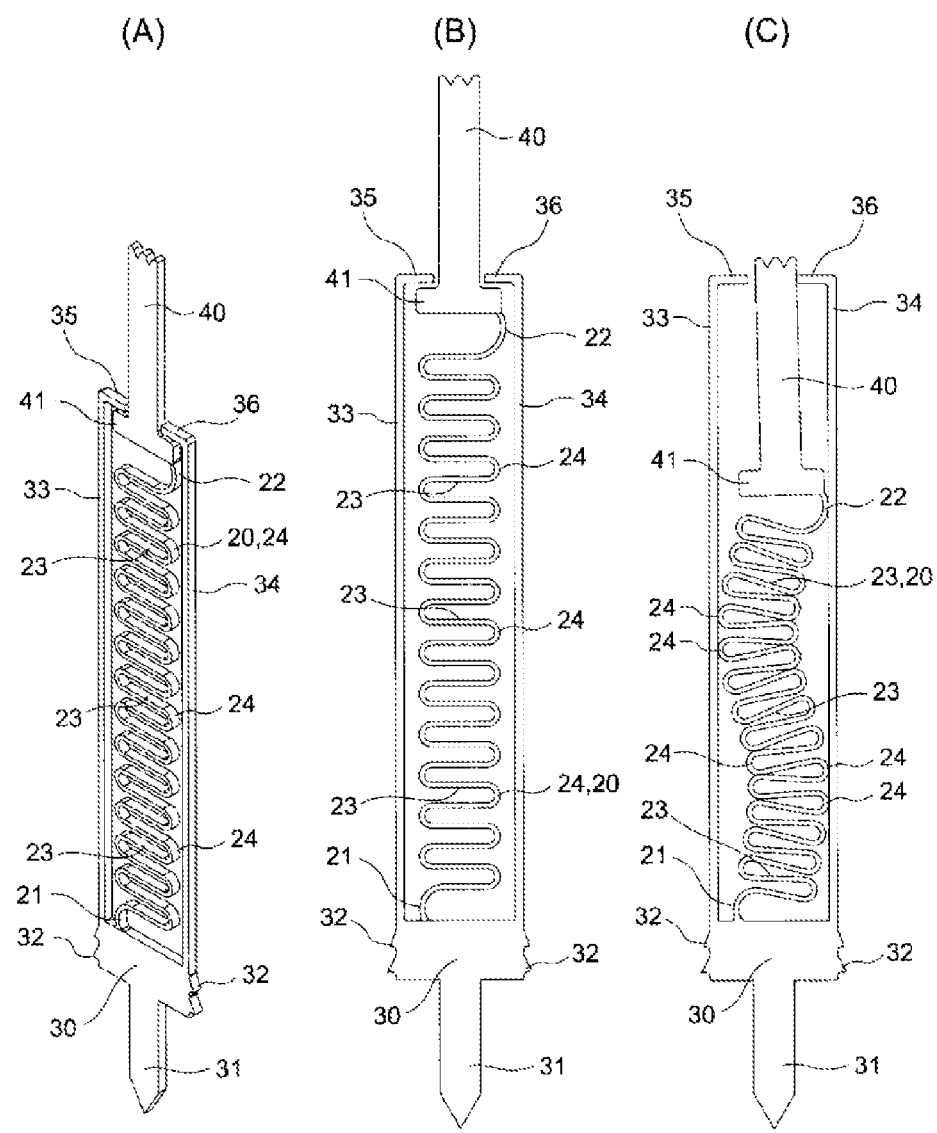
FIG. 3A is a perspective view showing a second embodiment of a contactor according to the present invention.
FIGS. 3B and 3C are front views respectively showing the contactor before and after the operation.
Figure 4:
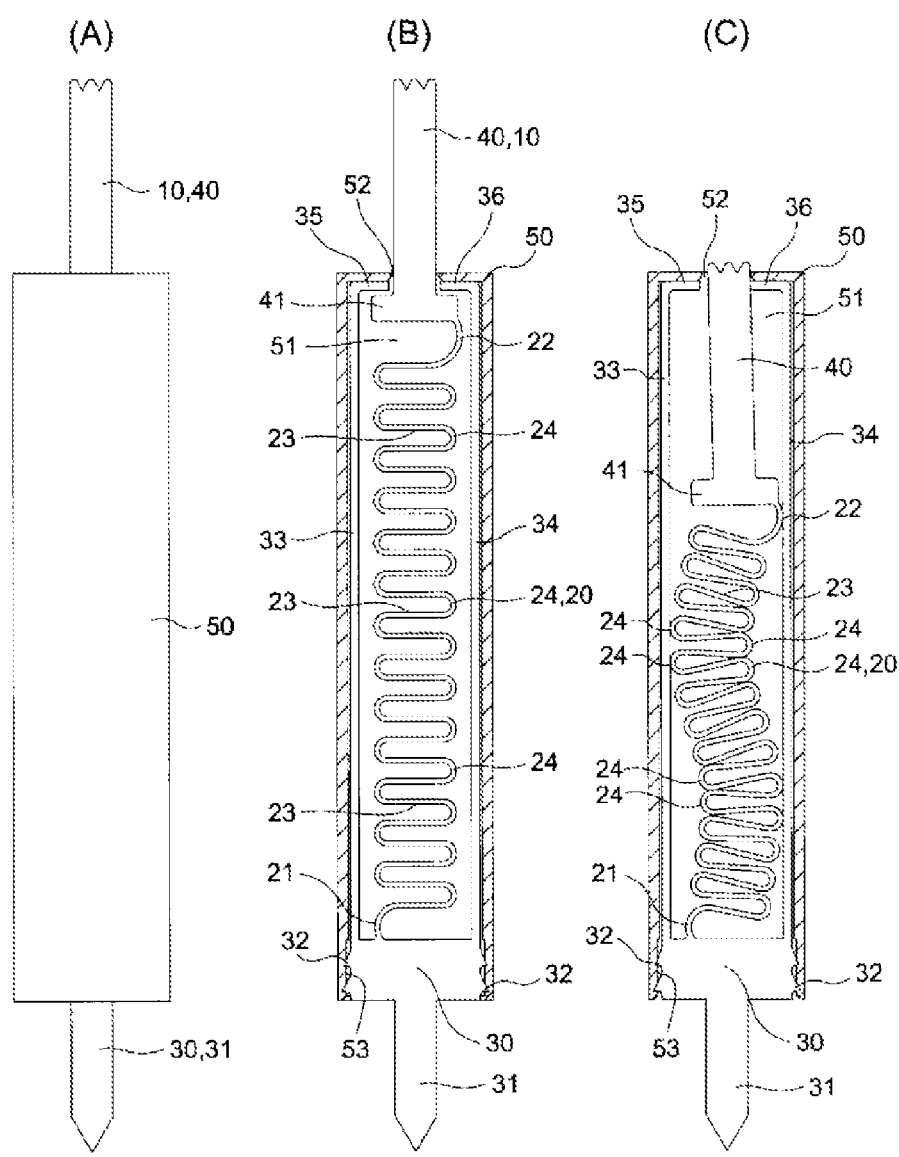
FIG. 4A is a front view of a state where the contactor shown in FIG. 3 has been housed inside a housing.
FIGS. 4B and 4C are front sectional views respectively showing the contactors before and after the operation.

As shown in FIGS. 3 and 4, a second embodiment is similar to the foregoing first embodiment, where a contactor 10 is formed of a bellows body 20, a fixed portion 30 connected to one end 21 of the bellows body 20, and a movable portion 40 connected to the other end 22 of the bellows body 20. The contactor 10 is housed inside a housing 50.

The bellows body 20 is formed of linear-shaped intermediate portions 23 and arc portions 24 each connecting adjacent intermediate portions 23.

The one end 21 of the bellows body 20 is connected to an eccentric position relative to a shaft center of the fixed portion 30 at the upper end thereof, and a terminal portion 31 is extended at the lower end of the fixed portion 30 along the shaft center. Further, locking claw portions 32 are projectingly provided on both side surfaces of the fixed portion 30, while fixed touch pieces 33, 34 are extended from both side edges of the upper end of the fixed portion 30 in parallel along the bellows body 20. Moreover, the fixed touch pieces 33, 34 are provided with flexing portions 35, 36 formed by flexing the upper ends thereof inward, to prevent slipping-out of the later-mentioned movable portion 40.

The movable portion 40 has the front surface in a substantially T-shape, and the other end 22 of the bellows body 20 is connected to an eccentric position relative to a shaft center at the lower end of a large width portion 41 of the movable portion 40.

As shown in FIG. 4, the housing 50 has a rectangular-parallelepiped shape having a slit 51 where the contactor 10 can be housed, and the upper end surface of the housing 50 has an operation hole 52, while the lower end surface thereof has a press-fitting hole 53.

When the movable portion 40 is pressed down, the bellows body 20 is compressed and also buckles, and thereby one side of the large width portion 41 comes into contact with an inner side surface of one of the fixed touch pieces 33, 34. In the meantime, the adjacent arc portions 24 come into contact with each other, while coming into contact with the inner side surfaces of the fixed touch pieces 33, 34, to cause a short circuit. Hence the contact resistance decreases according to a displacement amount of the movable portion 40, to allow a current to flow.

Figure 5:
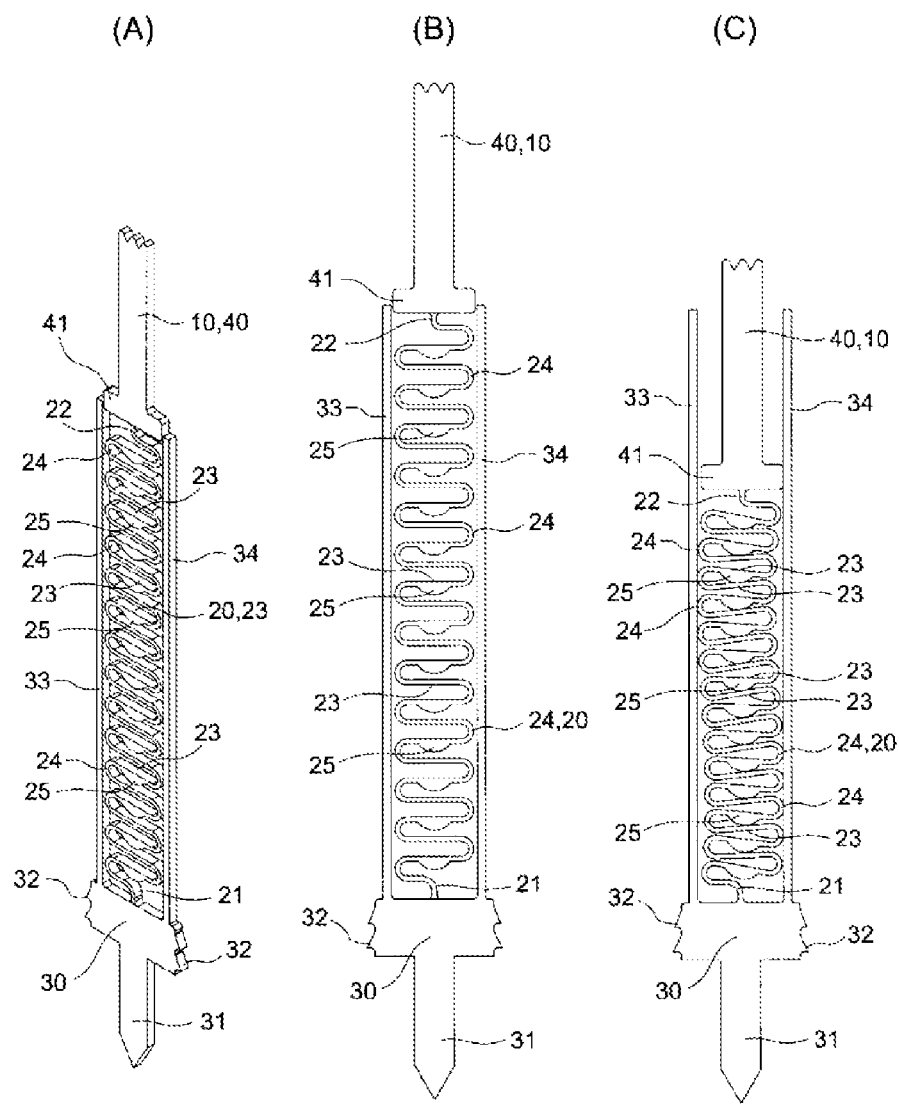
FIG. 5A is a perspective view showing a third embodiment of a contactor according to the present invention.
FIGS. 5B and 5C are front views respectively showing the contactor before and after the operation.
Figure 6:
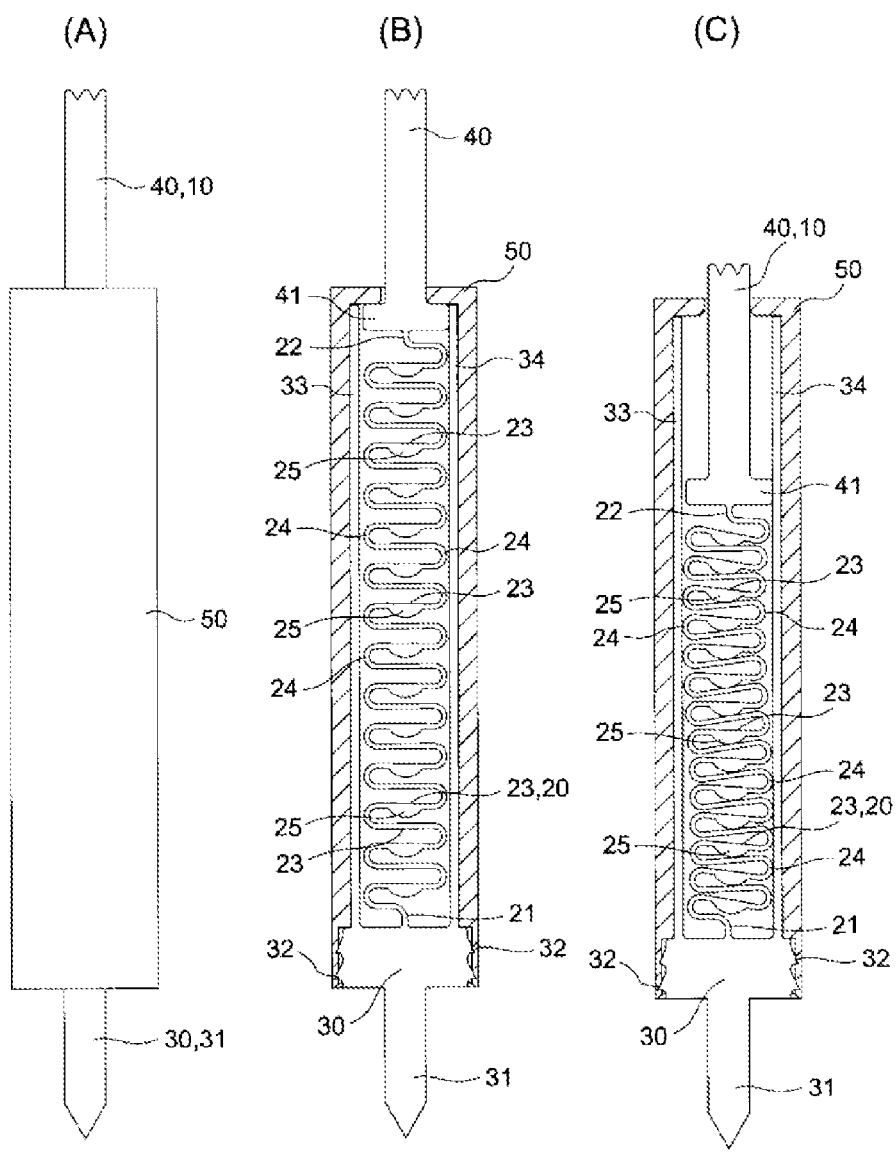
FIG. 6A is a front view of a state where the contactor shown in FIG. 5 has been housed inside a housing.
FIGS. 6B and 6C are front sectional views respectively showing the contactors before and after the operation.

As shown in FIGS. 5 and 6, a third embodiment is similar to the foregoing first embodiment, where a contactor 10 is formed of a bellows body 20, a fixed portion 30 connected to one end 21 of the bellows body 20, and a movable portion 40 connected to the other end 22 of the bellows body 20. The contactor 10 is housed inside a housing 50.

The third embodiment is different from the first embodiment in that a connecting projection 25 is provided on alternating intermediate portions 23 of the bellows body 20. Since the intermediate portions 23 without the connecting projection 25 are the same as those in the first embodiment, the same portion is provided with the same numeral and a description thereof will be omitted.

According to the present embodiment, as shown in FIG. 6, when the movable portion 40 is pressed down, the bellows body 20 is compressed, and thereby the large width portion 41 slides on the inner side surface of either the fixed touch pieces 33 or 34. In the meantime, the connecting projections 25 of the bellows body 20 comes into contact with the intermediate portions 23 opposed thereto, while the adjacent arc portions 24 comes into contact with either of the fixed touch pieces 33 or 34, to cause a short circuit, whereby the contact resistance decreases and a current flows.

Figure 7:
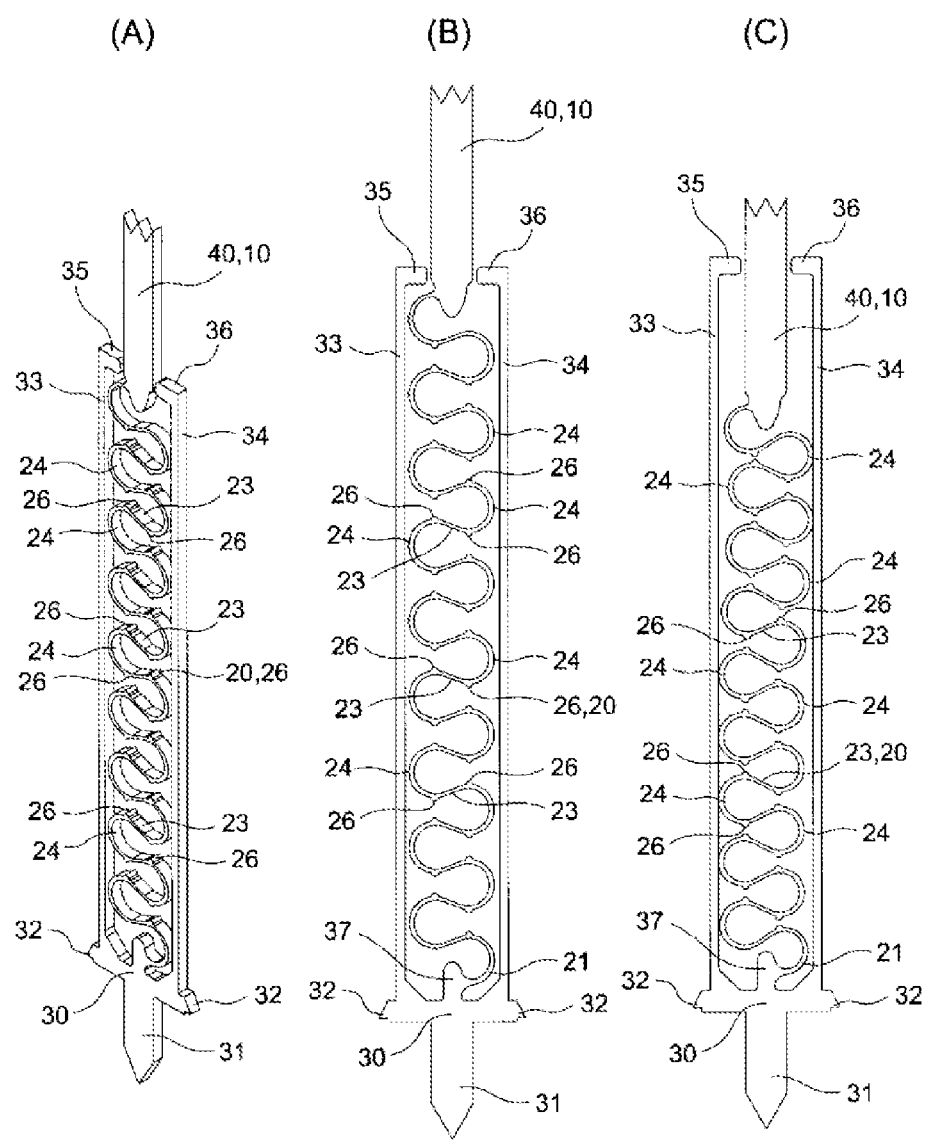
FIG. 7A is a perspective view showing a fourth embodiment of a contactor according to the present invention.
FIGS. 7B and 7C are front views respectively showing the contactor before and after the operation.
Figure 8:
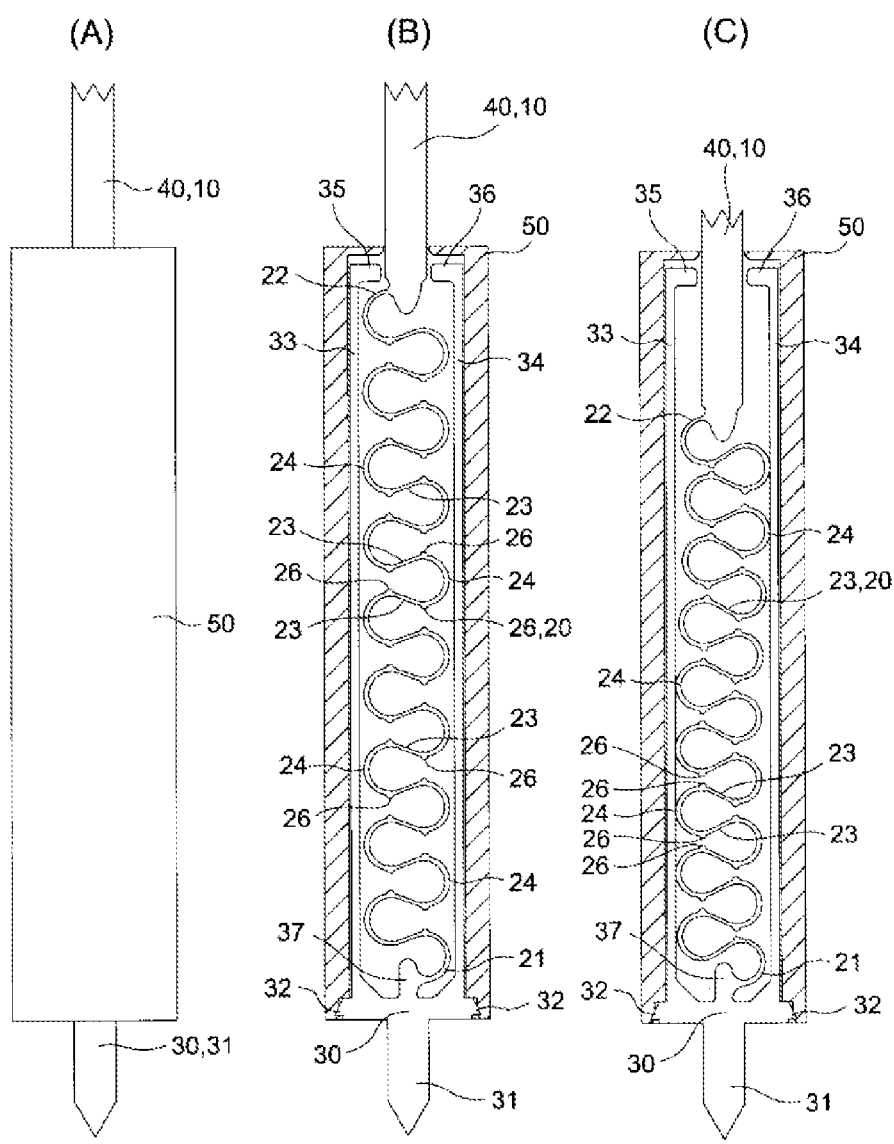
FIG. 8A is a front view of a state where the contactor shown in FIG. 5 has been housed inside a housing.
FIGS. 8B and 8C are front sectional views respectively showing the contactors before and after the operation.

As shown in FIGS. 7 and 8, a fourth embodiment is almost the same as the foregoing first embodiment, where a contactor 10 is formed of a bellows body 20, a fixed portion 30 connected to one end 21 of the bellows body 20, and a movable portion 40 connected to the other end 22 of the bellows body 20. The contactor 10 is housed inside a housing 50.

The bellows body 20 is formed of curve-shaped intermediate portions 23, and arc portions 24 each connecting adjacent intermediate portions 23. The bellows body 20 further includes connecting projections 26, which can come into contact with each other, and are provided on each boundary between the intermediate portion 23 and the arc portion 24.

The one end 21 of the bellows body 20 is connected to a contacting shaft portion 37 projectingly provided at a shaft center of the fixed portion 30 on the upper end thereof, and a terminal portion 31 is extended at the lower end of the fixed portion 30 along the shaft center. Further, locking claw portions 32 are projectingly provided on both side surfaces of the fixed portion 30, while fixed touch pieces 33, 34 are extended from both side edges of the upper end of the fixed portion 30 in parallel along the bellows body 20. Moreover, the fixed touch pieces 33, 34 are provided with flexing portions 35, 36 formed by flexing the upper ends thereof inward, to prevent slipping-out of the later-mentioned bellows body 20.

The movable portion 40 has a front surface in a substantially I-shape, and the other end 22 of the bellows body 20 is connected to an eccentric position relative to a shaft center of the lower end of the movable portion 40.

As shown in FIG. 8, the housing 50 has a rectangular-parallelepiped shape having a slit 51 where the contactor 10 can be housed, and the upper end surface of the housing 50 has an operation hole 52, while the lower end surface thereof has a press-fitting hole 53.

According to the present embodiment, as shown in FIG. 8, when the movable portion 40 is pressed down, the bellows body 20 is compressed and buckles, and thereby the arc portions 24 comes into contact with the inner side surfaces of the fixed touch pieces 33, 34, while the adjacent connecting projections 26 of the bellows body 20 come into contact with each other, to cause a short circuit, whereby the contact resistance decreases and a current flows.

EXAMPLE 1

Figure 9:
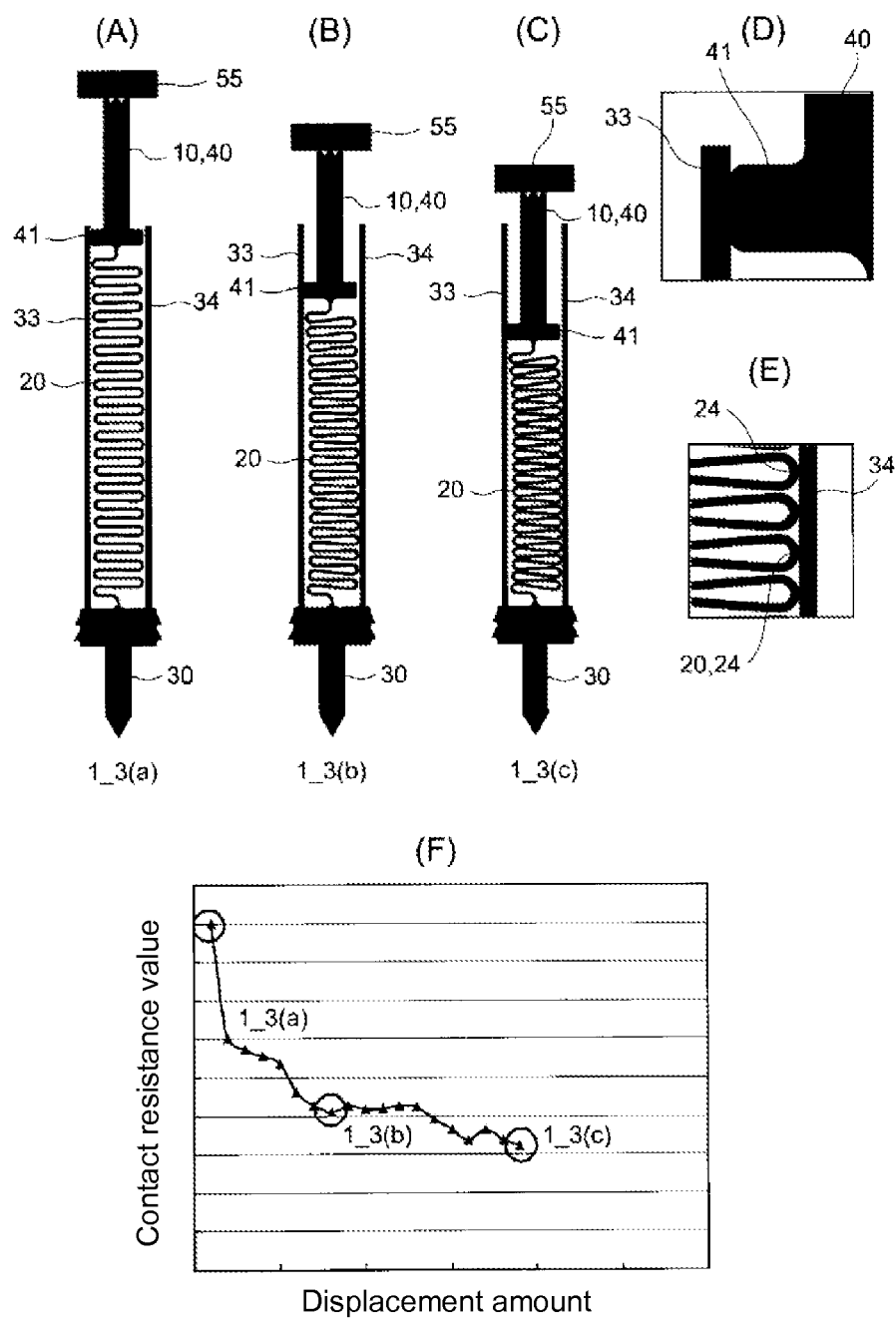
FIGS. 9A, 9B and 9C are front views showing an operating process of the first embodiment.
FIG. 9D is a partially enlarged view of FIG. 9A.
FIG. 9E is a partially enlarged view of FIG. 9C.
FIG. 9F is a graph showing results of measurement of the relation between a displacement amount and a contact resistance.

The relation between the displacement amount and the contact resistance value of the contactor according to the first embodiment was measured. FIG. 9F graphically shows a result of the measurement.

As apparent from FIG. 9F, before the operation (FIG. 9A), the contact resistance value is extremely large, and a current hardly flows.

When an operation body 55 of the movable portion 40 is pressed down, the large width portion 41 of the movable portion 40 comes into contact with the inner side surfaces of the fixed touch pieces 33, 34 (FIGS. 9A, 9D), the contact resistance values abruptly decreases, and a current starts to flow.

Further, when the movable portion 40 is pressed down (FIGS. 9B, 9C), the adjacent arc portions 24 of the bellows body 20 come into contact with each other to cause a short circuit, while coming into contact with the fixed touch piece 34 (FIG. 9E). Hence the contact resistance gradually decreases, and a current stably flows.

From the foregoing example 1, it was found that the above contactor is not only usable as an integrated circuit inspection probe, but also usable as a switch, for example.

Especially when it is used as the integrated circuit inspection probe, since the above contactor can be formed with a small thickness, it is possible to arrange a large number of contactors at narrow pitches, while obtaining an integrated circuit inspection probe with a small number of components. Further, when it is used as the switch, a switch with good responsiveness can be obtained.

EXAMPLE 2

Figure 10:
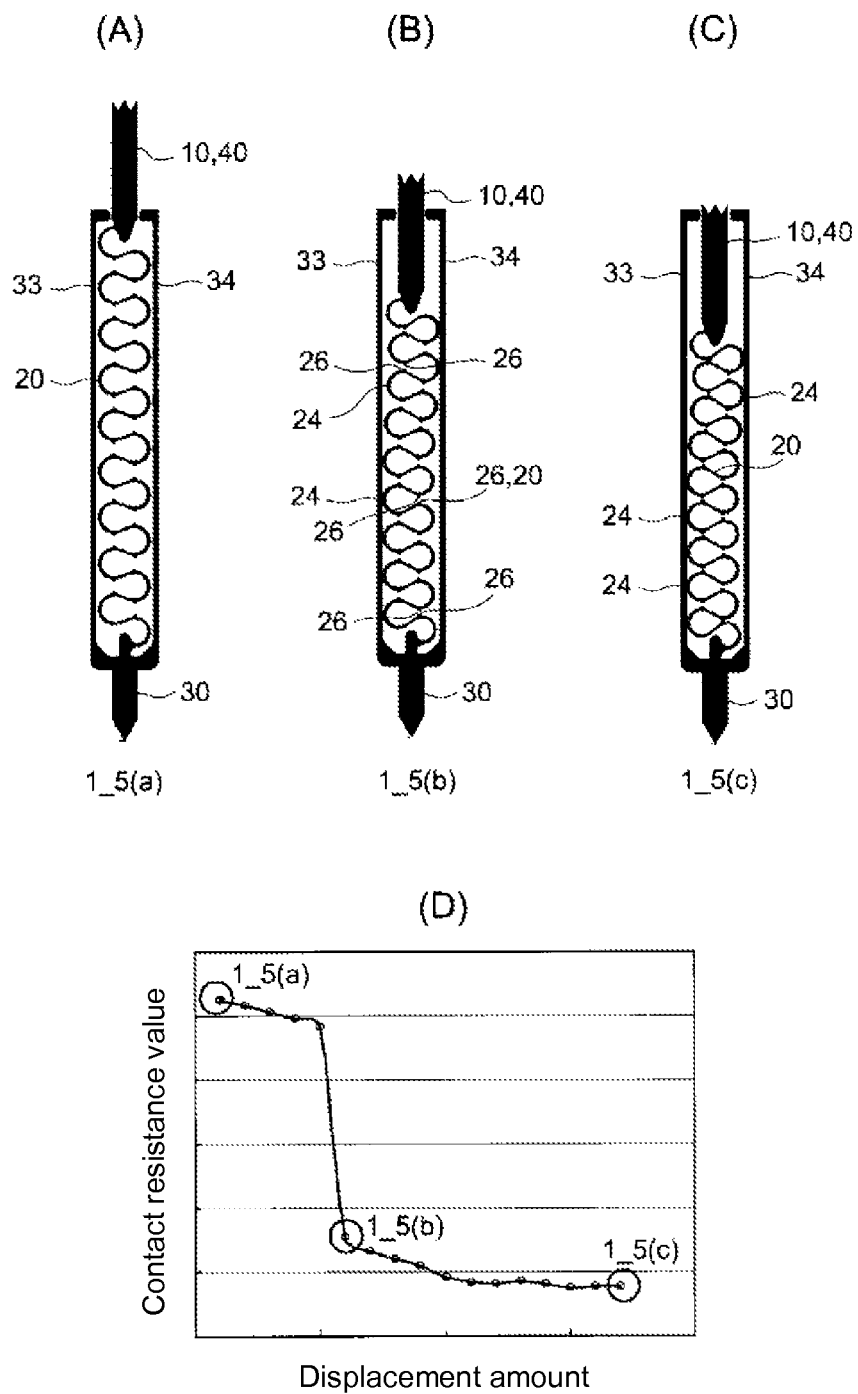
FIGS. 10A, 10B and 10C are front views showing an operating process of the first embodiment.
FIG. 10D is a graph showing results of measurement of the relation between a displacement amount and a contact resistance.

The relation between the displacement amount and the contact resistance value of the contactor according to the fourth embodiment was measured. FIG. 10D graphically shows a result of the measurement.

As apparent from FIG. 10D, before the operation (FIG. 10A), the contact resistance value is extremely large, and a current hardly flows.

Even when the movable portion 40 is pressed down, the contact resistance value does not abruptly decrease until a predetermined displacement amount is reached. However, when the predetermined displacement amount is reached (FIG. 10B), a buckling amount rapidly increases, and thereby the arc portion 24 of the bellows body 20 comes into contact with the inner side surfaces of the fixed touch pieces 33, 34, to cause a short circuit. Hence the contact resistance value abruptly decreases, and a current starts to flow.

Further, when the movable portion is pressed down (FIG. 10C), the adjacent connecting projections 26 of the bellows body 20 come into contact with each other to cause a short circuit, and thereby the contact resistance gradually decreases and a current stably flows.

From the foregoing example 2, it was found that the above contactor is not only usable as an integrated circuit inspection probe, but also usable as a switch.

Especially when it is used as the integrated circuit inspection probe, since the above contactor can be formed with a small thickness, it is possible to arrange a large number of contactors at narrow pitches, while obtaining an integrated circuit inspection probe with a small number of components. Further, when it is used as the switch, since a current starts to flow after pressing-down in a predetermined amount, it is possible to obtain a switch with different operating characteristics from those of the first embodiment.

The contactor according to the present invention is not only usable as an integrated circuit inspection probe or a switch, but may also be used as a contact terminal of a battery.

Needless to say, the housing is not restricted to an integrally molded one, but may be one dividable into two parts.

According to the present invention, even when the bellows body is made long for the purpose of ensuring a desired displacement amount, a short-circuit occurs by contact between the movable portion and/or the bellows body, and the fixed touch piece of the fixed portion, thus making it possible to reduce contact resistance so as to obtain a contactor with small contact resistance.

As mentioned, the bellows body may have a shape made up of linear-shaped intermediate portions and arc portions each configured to connect the adjacent intermediate portions. Accordingly, it is possible to obtain a contactor easy to design.

As discussed above, a connecting projection may be provided at at least one of adjacent intermediate portions of the bellows body. Accordingly, it is possible to obtain a contactor with lower contact resistance by occurrence of a short circuit via the connecting projection.

As also discussed, the bellows body may have a shape made up of curve-shaped intermediate portions and arc portions each configured to connect the adjacent intermediate portions. Accordingly, there is an advantage of increasing the design flexibility.

As described above, a connecting projection, configured to come into contact with the intermediate portion and an arc portion, may be provided on a boundary therebetween in the bellows body. Accordingly, it is possible to obtain a contactor with lower contact resistance by occurrence of a short circuit via the connecting projection.

As further discussed herein, the fixed touch piece may be extended from each side edge of the fixed portion in parallel along the bellows body. Such a pair of fixed touch pieces serves as a guide member to stabilize operating characteristics, while the movable portion and the bellows body do not fail to come into contact with any one of the pair of fixed touch pieces, thereby making it possible to obtain a contactor with high contact reliability.

As described, a position of contact between the bellows body and the fixed portion may be arranged on a shaft center of the fixed portion, or the position of contact between the bellows body and the fixed portion may be arranged on an eccentric position from the shaft center of the fixed portion. Accordingly, when the position of contact between the bellows body and the fixed portion is arranged on the shaft center of the fixed portion, there can be obtained a contactor being operable by a small force of operation and having a long usage life. Meanwhile, when the position of contact between the bellows body and the fixed portion is arranged on an eccentric position from the shaft center of the fixed portion, the bellows body is apt to buckle, and hence it is possible to obtain a contactor with high contact pressure.

Similarly, as discussed herein, a position of contact between the bellows body and the movable portion may be arranged on a shaft center of the movable portion, or the position of contact between the bellows body and the movable portion may be arranged on an eccentric position from the shaft center of the movable portion. Accordingly, when the position of contact between the bellows body and the movable portion is arranged on the shaft center of the movable portion, there can be obtained a contactor being operable by a small force of operation and having a long usage life. Meanwhile, when the position of contact between the bellows body and the movable portion is arranged on an eccentric position from the shaft center of the movable portion, the bellows body is apt to buckle, and there is thus an effect of being able to obtain a contactor with high contact pressure.

Although the invention has been described in detail for the purpose of illustration based on what is currently considered to be the most practical and preferred embodiments, it is to be understood that such detail is solely for that purpose and that the invention is not limited to the disclosed embodiments, but, on the contrary, is intended to cover modifications and equivalent arrangements that are within the spirit and scope of the appended claims. For example, it is to be understood that the present invention contemplates that, to the extent possible, one or more features of any embodiment can be combined with one or more features of any other embodiment.

The invention claimed is:

1. A contactor comprising:
   a bellows body;
   a fixed portion connected to one end of the bellows body and provided with at least one fixed touch piece extending along the bellows body; and
   a movable portion, connected to the other end of the bellows body
   wherein the movable portion is configured to be depressed to compress the bellows body and to bring the movable portion into contact with the fixed touch piece of the fixed portion creating a short-circuit in the contactor.

2. The contactor according to claim 1, wherein the bellows body is made up of linear-shaped intermediate portions and arc portions connecting adjacent intermediate portions.

3. The contactor according to claim 2, wherein a connecting projection is provided at at least one of the adjacent intermediate portions of the bellows body.

4. The contactor according to claim 1, wherein the bellows body is made up of curve-shaped intermediate portions and arc portions connecting adjacent intermediate portions.

5. The contactor according to claim 4, wherein a connecting projection, configured to come into contact with the intermediate portion and an arc portion, is provided on a boundary therebetween in the bellows body.

6. The contactor according to claim 1, wherein the fixed touch piece may be extended from each side edge of the fixed portion in parallel along the bellows body.

7. The contactor according to claim 1, wherein an end of the bellows body is connected to the fixed portion at a shaft center of the fixed portion.

8. The contactor according to claim 1, wherein an end of the bellows body is connected to the fixed portion at an eccentric position relative to a shaft center of the fixed portion.

9. The contactor according to claim 1, wherein the bellows body is connected to the movable portion at a shaft center of the movable portion.

10. The contactor according to claim 1, wherein the bellows body is connected to the movable portion at an eccentric position relative to a shaft center of the movable portion.

11. A contactor comprising:
    a bellows body;
    a fixed portion, connected to one end of the bellows body and provided with at least one fixed touch piece extending along the bellows body; and
    a movable portion, connected to the other end of the bellows body,
    wherein the movable portion is configured to be depressed to compress the bellows body and to bring the bellows body into contact with the fixed touch piece of the fixed portion creating a short-circuit in the contactor.

12. The contactor according to claim 11, wherein the bellows body is made up of linear-shaped intermediate portions and arc portions connecting adjacent intermediate portions.

13. The contactor according to claim 12, wherein a connecting projection is provided at at least one of the adjacent intermediate portions of the bellows body.

14. The contactor according to claim 11, wherein the bellows body is made up of curve-shaped intermediate portions and arc portions connecting adjacent intermediate portions.

15. The contactor according to claim 14, wherein a connecting projection, configured to come into contact with the intermediate portion and an arc portion, is provided on a boundary therebetween in the bellows body.

16. The contactor according to claim 11, wherein the fixed touch piece may be extended from each side edge of the fixed portion in parallel along the bellows body.

17. The contactor according to claim 11, wherein an end of the bellows body is connected to the fixed portion at a shaft center of the fixed portion.

18. The contactor according to claim 11, wherein an end of the bellows body is connected to the fixed portion at an eccentric position relative to a shaft center of the fixed portion.

19. The contactor according to claim 11, wherein the bellows body is connected to the movable portion at a shaft center of the movable portion.

20. The contactor according to claim 11, wherein the bellows body is connected to the movable portion at an eccentric position relative to a shaft center of the movable portion.

* * * * *